US010755799B1

(12) United States Patent
Montierth

(10) Patent No.: US 10,755,799 B1
(45) Date of Patent: Aug. 25, 2020

(54) APPARATUSES AND METHODS FOR FUSE LATCH REDUNDANCY

(71) Applicant: MICRON TECHNOLOGY, INC., Boise, ID (US)

(72) Inventor: Dennis G. Montierth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/384,757

(22) Filed: Apr. 15, 2019

(51) Int. Cl.
  G11C 17/18    (2006.01)
  G11C 29/00    (2006.01)
  G11C 11/4094  (2006.01)
  G11C 7/10     (2006.01)
  G11C 11/408   (2006.01)

(52) U.S. Cl.
  CPC ............ *G11C 29/789* (2013.01); *G11C 7/109* (2013.01); *G11C 7/1063* (2013.01); *G11C 11/4085* (2013.01); *G11C 11/4094* (2013.01); *G11C 29/802* (2013.01); *G11C 29/816* (2013.01)

(58) Field of Classification Search
  CPC ..... G11C 29/789; G11C 7/1063; G11C 7/109; G11C 11/4085

USPC ...................................................... 365/225.7
See application file for complete search history.

(56) References Cited

U.S. PATENT DOCUMENTS

| 7,495,977 | B1* | 2/2009 | Moscaluk | G11C 29/72 365/200 |
| 9,870,837 | B1* | 1/2018 | Shim | G11C 17/16 |
| 2005/0138513 | A1* | 6/2005 | Mondal | G11C 29/44 714/733 |

* cited by examiner

*Primary Examiner* — Vu A Le
(74) *Attorney, Agent, or Firm* — Dorsey & Whitney LLP

(57) ABSTRACT

Embodiments of the disclosure are drawn to apparatuses and methods for storing an enable state of an address. The address may be broadcast from a fuse array to a fuse latch, and may be associated with enable information. The fuse latch may include a plurality of enable latch circuits, each of which may receive the enable information in common, and each of which may store the enable information as an enable bit. Each of the enable latch circuits may provide a respective enable signal based on a state of the stored enable bit. An enable logic circuit may provide an overall enable signal with a state determined by the states of all of the enable signals from the plurality of enable latch circuits.

20 Claims, 5 Drawing Sheets

APPARATUSES AND METHODS FOR FUSE LATCH REDUNDANCY

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines). At various points in manufacturing and use of a memory device, one or more memory cells may fail (e.g., become unable to store information, be inaccessible by the memory device, etc.) and may need to be repaired.

The memory device may be directed to repair failed memory cells. The memory device may contain additional rows of memory (which may also be referred to as redundant rows) and additional columns of memory (redundant columns) which may be used in repair operations. During a repair operation, an address associated with the defective memory cells may be redirected, such that the address is now associated with a redundant row and/or column instead. It may be desirable to increase the reliability of repair operations.

DETAILED DESCRIPTION

Figure 1:
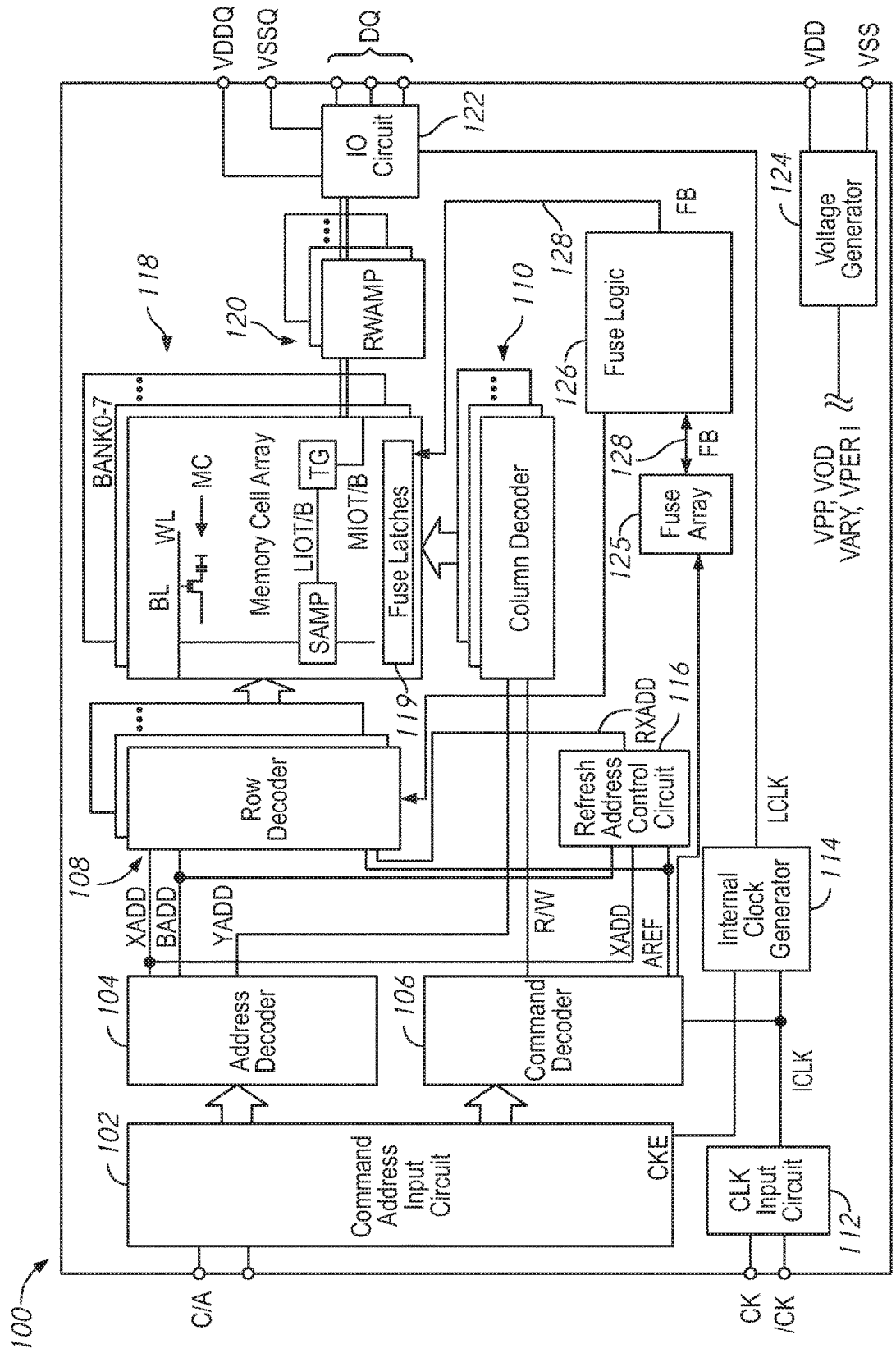
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in a plurality of memory cells. The information may be stored as a binary code, and each memory cell may store one or more bits of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column).

Certain memory cells may be defective, and rows containing the defective memory cells may generally be referred to as defective rows (or bad rows or faulty rows) while columns containing the defective memory cells may generally be referred to as defective columns (or bad columns or faulty columns). The defective memory cells may be incapable of storing information and/or may become otherwise inaccessible to the memory device. The memory device may carry out one or more repair operations in order to resolve the defective memory cells. In general, the repair operation may involve reassigning an address which referred to the defective row/column so that it refers to a functional row/column instead.

For example, memory banks may generally include a number of additional rows and/or additional columns of memory, which may generally be referred to as redundant rows and redundant columns respectively. During a repair operation, an address associated with a group of memory cells including the defective memory cells (e.g., a row/column address associated with a defective row/column) may be redirected so that it is associated with one of the groups of redundant memory cells instead. The memory may include memory elements which are used to assign addresses to the redundant rows. For example, the memory may include non-volatile memory elements, such as fuses (or anti-fuses) arranged in a fuse array. The states of the fuses may be permanently changed during a repair operation to reassign an address to the redundant rows.

Enable information may be associated with the redundant row to indicate that the redundant row is now in use. The enable information may generally be stored as an enable bit in a latch circuit. Since the enable information may generally only be a single bit, it may be particularly prone to error if the latch fails and changes the state of the stored bit.

The present disclosure is generally directed to apparatuses and methods for storing the enable information associated with a redundant row or column of memory. Each redundant row/column may be associated with a fuse latch circuit, which may include an address latch which stores the repaired address, and multiple enable latches, each of which stores an enable bit based on the enable information. Since there are multiple redundant enable latches, the probability of the enable information being lost may be dramatically decreased.

In some embodiments, if the multiple redundant enable latches do not all share the same information (e.g., if the state of one of the enable latches has changed), enable logic may be used to determine overall enable information based on the enable bits stored in the enable latches. In some embodiments, since it may generally be assumed that most of the redundant rows are not in use, the enable logic may bias the overall enable information toward a particular result (e.g., disabled). This may increase the odds that the original enable information is preserved even if one or more of the redundant enable latches fails (e.g., changes the state of the stored enable bit).

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The device also includes a fuse array 125, which contains a plurality of non-volatile storage elements which may store information about addresses in the memory array 118. The fuse array 125 includes non-volatile storage elements, such as fuses or anti-fuses. Each fuse may be in a first state where it is conductive, and may be 'blown' to make the fuse insulating instead. Each anti-fuse may be in a first state which is non-conductive, until it is blown to make the anti-fuse conductive instead. Each fuse/anti-fuse may permanently change when it is blown. Each fuse/anti-fuse may be considered to be a bit, which is in one state before it is blown, and permanently in a second state after it's blown. For example, a fuse may represent a logical low before it is blown and a logical high after it is blown, while an anti-fuse may represent a logical high before it is blown and a logical low after it is blown.

Specific groups of fuses/anti-fuses may be represented by a fuse bank address FBA, which may specify the physical location of each of the fuses/anti-fuses in the group within the fuse array 125. The states of a group of fuses/anti-fuses associated with a particular FBA may in turn encode an address associated with one or more memory cells of the memory array 118. For example, a group of fuses/anti-fuses may have a state which represents a row address. The address information in the fuse array 125 may be 'scanned' out along a fuse bus (FB) 128 to fuse latches 119. Which may be row or column latches. While only row latches are described in the example of FIG. 1, it should be understood that column latches may be used instead (or in addition to) and may function in a similar way as the row latches 119 as described herein.

Each row latch 119 may be associated with a particular wordline of the memory array 118. In some embodiments, only the redundant rows of the memory array 118 (e.g., the rows designated for use in repair operations) may be associated with one of the row latches 119. The address stored in a given group of fuses/anti-fuses may be scanned out from the fuse array 125 along the fuse bus 128, and may be stored by a particular row latch 119. In this manner, an address stored in the fuse array 125 may be associated with a particular row of the memory array 118. The row latch circuit 119 may also store enable information associated with the address, which may indicate that the redundant row is now in use. The address and the enable information stored in the row latch 119 may then direct access commands to the wordlines associated with the row latch 119.

Each of the row latches 119 may include an address latch which stores the address, and a number of enable latches, each of which redundantly stores the enable information associated with the address. In some embodiments, the enable information may be a single bit, with one logical state (e.g., the high logical state) indicating that the row is in use, while the other logical state (e.g., the low logical state) indicating that the row is open (e.g., not in use). The enable latches may store the enable bits, and may each provide an enable signal based on the value of the stored enable bit. An enable logic circuit may determine a value for an overall enable signal based on the enable signals. The overall enable signal may represent the original state of the enable information, and since it is based on multiple, independent, enable latch circuits, may be less prone to error.

The enable information may be based on the address provided along the fuse bus 128. For example, the enable information may be included as an extra bit provided with the address such that, if the address information is n bits long, then the row latch may receive n+1 bits from the fuse bus 128, with the extra bit containing the enable information. In some embodiments, the enable information may be determined based on a state of one or more bits of the address.

Each of the enable latch circuits in a given one of the row latches 119 may intermittently fail. The failure may cause a state of the enable information stored in the failed enable latch circuit to change (e.g., from high to low or from low to high). If the overall enable signal were based on only a single enable latch, this would cause the original enable information to be lost. However, since there are multiple enable latches each independently storing the same enable information, the probability that the enable information is lost (e.g., by all of the enable latches failing) decreases with each additional enable latch circuit. The enable logic circuit may be coupled to each of the enable latch circuits of a given row latch 119, and may determine an overall enable signal for the row latch based on the enable information stored in each of the enable latch circuits. The overall enable signal may then be used to determine if the row associated with the row latch 119 is in use or not during an access operation (e.g., read, write, etc.) of the memory device 100.

The enable logic circuit may use internal logic to determine the overall enable signal if the information in the enable latch circuits do not all agree with each other. In some embodiments the enable logic circuit may be biased towards a particular result. This may be useful when it is expected that most of the redundant rows will generally be in the same state. For example, in many scenarios it may be assumed that most of the redundant rows will not be enabled. In such a scenario, the enable logic circuit may bias the overall enable signal towards being disabled. This may help increase the probability that the overall enable signal matches the original enable information.

A fuse logic circuit 126 may be positioned along the fuse bus 128. The fuse logic circuit 126 may monitor information along the fuse bus 128 and may selectively change the information along the fuse bus 128. For example, the fuse logic circuit 126 may include volatile memory elements (e.g., memory cells, latch circuits, etc.) and may be capable of performing a 'soft' repair without changing the states of the fuse array 125. In a soft repair, the fuse logic circuit 126 may monitor the fuse bus 128, and selectively change information along the fuse bus 128 based on the addresses stored in the volatile memory elements such that the address in the volatile memory elements (rather than the address stored in the fuse array 125) is broadcast to the row latches 119.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder may access the wordline associated with the row latch 119 which has an address which matches XADD. The read command is received by the command decoder 106, which provides internal commands so that read data from the memory array 118 is provided to the read/write amplifiers 120. The row decoder 108 may match the address XADD to an address stored in a row latch 119, and then may access the physical row associated with that row latch 119. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address XADD and column address YADD. The write command is received by the command decoder 106, which provides internal commands so that the write data is received by data receivers in the input/output circuit 122. The row decoder 108 may match the address XADD to an address stored in a row latch 119, and then access the physical row associated with that row latch 119. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out an auto-refresh operation. The refresh signal AREF may be a pulse signal which is activated when the command decoder 106 receives a signal which indicates an auto-refresh command. The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
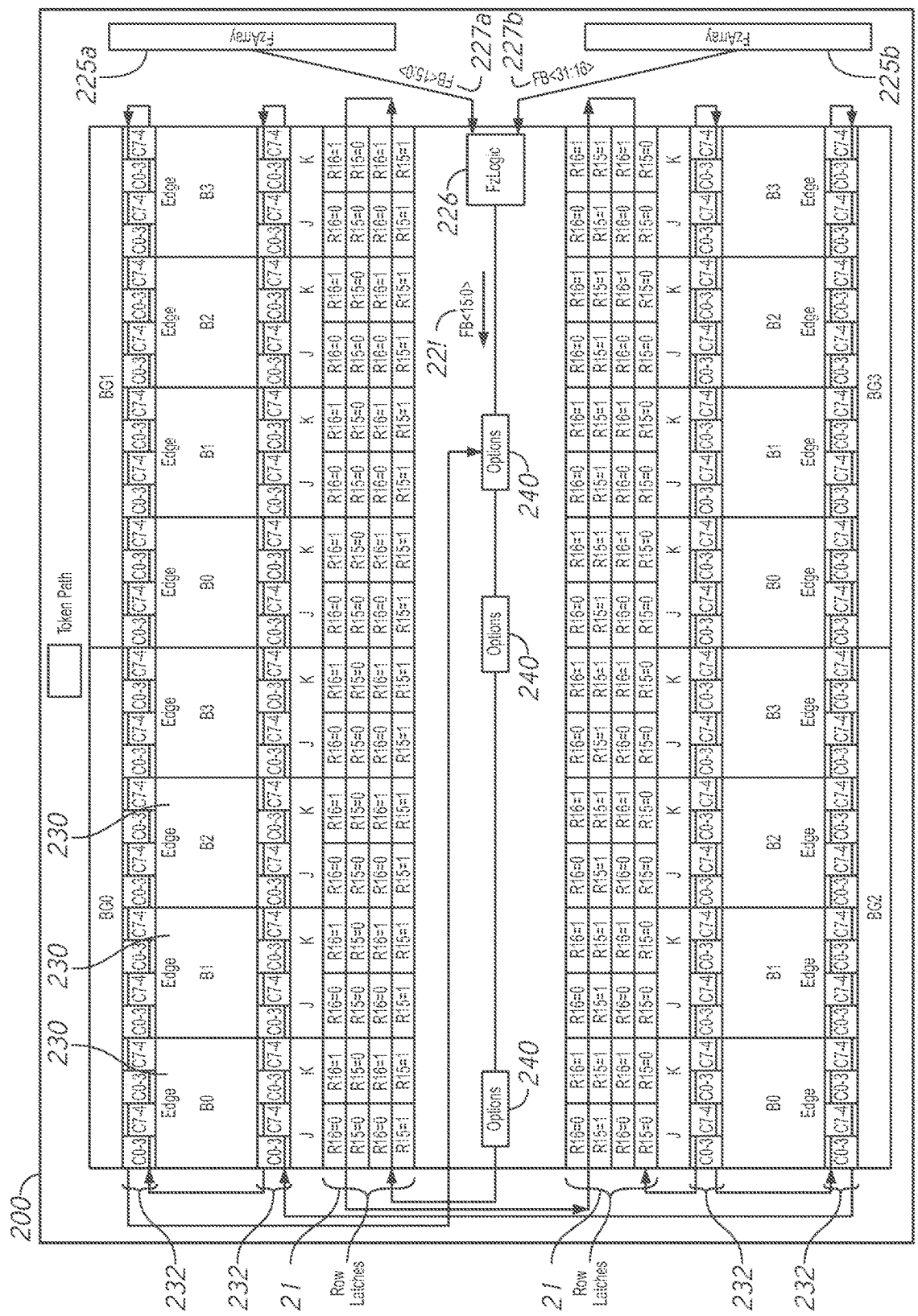
FIG. 2 is a block diagram representing a memory device according to an embodiment of the present disclosure.

FIG. 2 is a block diagram representing a memory device according to an embodiment of the present disclosure. FIG. 2 shows the transmission path of a fuse bus 228 from a pair of fuse arrays 225*a* and 225*b* through a memory array 200. In some embodiments, the memory array 200 may be an implementation of the memory array 118 of FIG. 1. However, the memory array 200 includes 16 banks 230 rather than the eight banks previously described with reference to the memory array 118. The 16 banks 230 are organized into four bank groups (BG0-BG3) of four banks 230 each. Each of the banks 230 is associated with a set of row latches 219 and column latches 232.

Addresses may be scanned out as part of fuse data along a fuse bus 228 from the fuse array 225*a*-*b*. In the particular embodiment of FIG. 2, there may be a pair of fuse arrays 225*a* and 225*b*. The fuse array 225*a* may include a set of anti-fuses which may generally be used to store address information for a first portion of row addresses. The fuse array 225*b* may include a set of fuses which may generally be used to store address information for a second portion of row addresses. In some embodiments, the row addresses may be divided between the first portion and the second portion based on a numerical value assigned to the address. For example, the addresses may be sorted by numerical value, row addresses with the smaller values may be assigned to fuse array 225*a*, while row addresses with the larger values assigned to fuse array 225*b*. Since the value of the address may be expressed as a number in binary, for numbers with a high value, most of the bits of the number may be at a high logical level, while numbers with a low value may have most of the bits at a low logical level. Thus, it may be more efficient to store high value addresses in the fuse array 225*b*, which includes fuses that default to a high logical level and low value addresses in the fuse array 225*a*, which includes anti-fuses which default to a low logical level. Thus, a high value address assigned to the fuse array 225*b* may require less fuses to be blown than it would require anti-fuses to be blown in the fuse array 225*a*.

In some embodiments, the fuse array 225*a* may include anti-fuses, and may be a non-inverting fuse array (since the default value of the anti-fuses is a low logical level) and the fuse array 225*b* may include fuses and be an inverting fuse array. In some embodiments, it may be necessary to 'invert' an address (e.g., swap low logical levels for high logical levels and vice versa) provided from the inverting fuse array 225*b*.

While the organization of fuse arrays 225*a* and 225*b* will continue to be discussed herein as an example implementation, it should be understood that other methods of organizing addresses in the fuse array(s) may be used in other embodiments. For example, a single fuse array may be used with only fuses, only anti-fuses, or a mix thereof.

During a broadcast operation, the fuse arrays 225*a*-*b* may broadcast fuse data along the fuse bus 228, which may include the row addresses stored in the fuse arrays 225*a*-*b*. In the particular embodiment of FIG. 2, during the broadcast operation the fuse logic circuit 226 may receive a portion of the addresses along fuse bus portion 227*a* from the fuse array 225*a*, and a portion of the addresses along fuse bus portion 227*b* from the fuse array 225*b*. The fuse logic circuit 226 may combine the addresses onto the fuse bus 228 by alternating whether the addresses from the first fuse bus portion 227*a* or the second fuse bus portion 227*b* are provided along the fuse bus 228. For clarity, the addresses provided along the fuse bus portion 227*a* may be referred to as 'even' addresses and the addresses provided along the fuse bus portion 227*b* may be referred to as 'odd' addresses. It should be understood that even and odd addresses refers to the fuse array 225*a*-*b* the address is stored in, and that both fuse bus portions 227*a*-*b* may include addresses with numerical values which are both even and odd.

As previously described, the fuse logic circuit 226 may provide data along the fuse bus 228. The fuse logic circuit 226 may alternate between providing the even addresses from fuse bus portion 227*a* and the odd addresses from fuse bus portion 227*b* along the fuse bus 228. The fuse logic circuit 226 may also perform one or more operations based on the data of the fuse bus. For example, if one of the fuse arrays 225*a*-*b* is an inverting fuse array, the fuse logic circuit 226 may invert the value of addresses provided from the inverting fuse array.

The fuse bus 228 may pass data through one or more options circuits 240. The options circuits 240 may include various settings of the memory which may interact with the addresses along the fuse bus 228. For example, the options circuits 240 may include fuse settings, such as the test mode and power supply fuses. Data stored in the fuse arrays 225*a*-*b* may be latched and/or read by the options circuits 240, which may then determine one or more properties of the memory based on the options data provided along the fuse bus 228.

After passing through the options circuits 240 the fuse bus 228 may pass through the row latches 219 for all of the memory banks 230 before passing through the column latches 232 for all of the memory banks 230. As well as providing fuse data (including address data) along the fuse bus 228, the fuse logic circuit 226 may also provide one or more select signals along the fuse bus 228. The select signals may be associated with a particular packet of data along the fuse bus, and may determine which circuit along the fuse bus 228 the particular packet of data is associated with. For example, if a row latch select signal is in an active state, it may indicate that the packet of data is to be stored in a row latch 219. In some embodiments, this may overwrite an address already stored in the row latch 219 with the address from the fuse bus 228. Further select signals may be used to specify a particular location of the specific row latch 219 which is intended to store the packet of data (e.g., a bank group select signal, a bank select signal, etc.).

By monitoring the data on the fuse bus 228, providing specific select signals, and selectively altering certain data on the fuse bus 228, the fuse logic circuit 226 may perform a variety of repair operations on the memory. The row latches 219 and the column latches 232 may receive and store an address provided during a repair operation, and the memory may direct access operations based on the address (es) stored in the row and column latches, and on an enable state stored therein.

Figure 3:
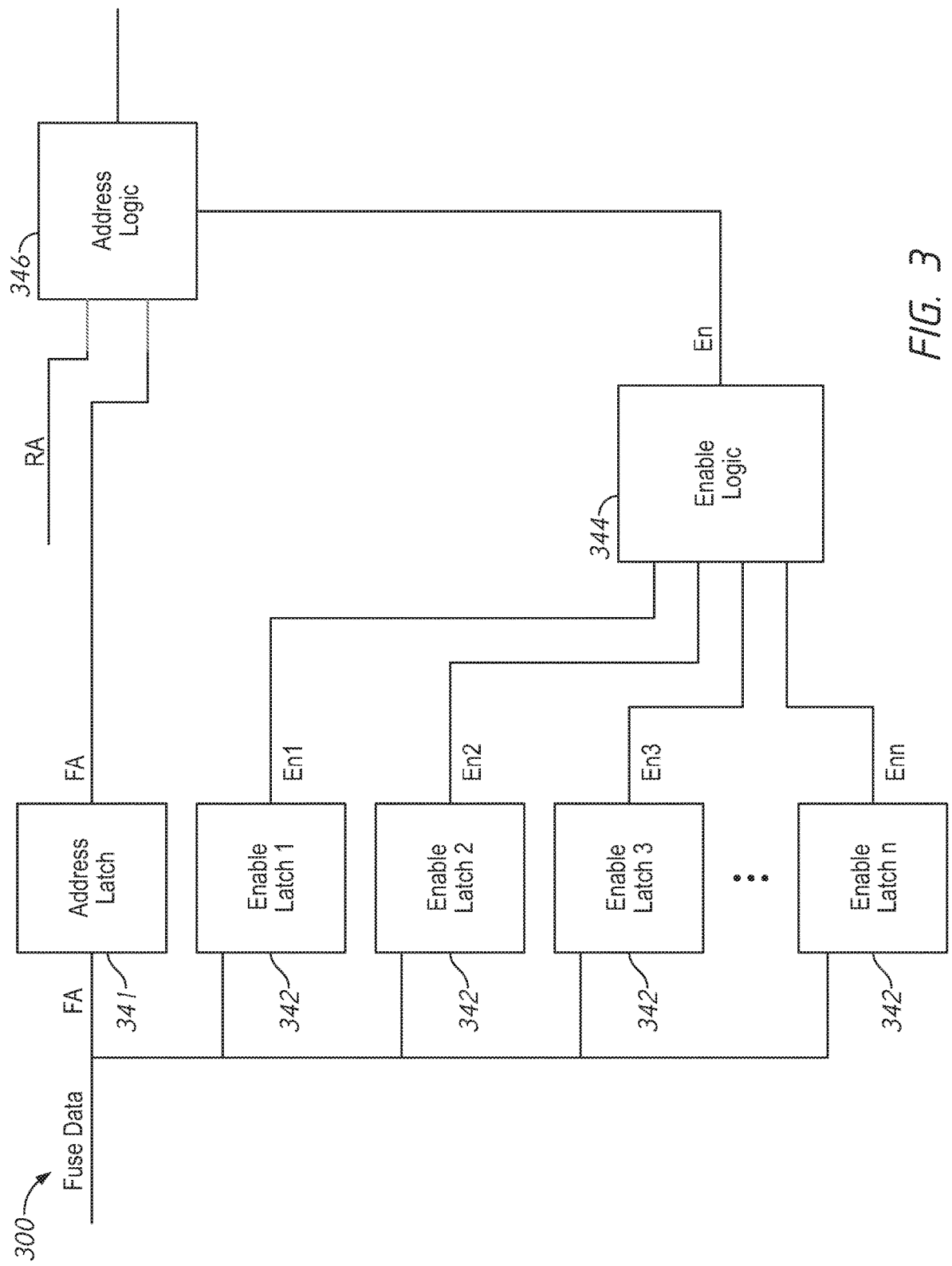
FIG. 3 is a block diagram showing a fuse latch circuit according to an embodiment of the present disclosure.

FIG. 3 is a block diagram showing a fuse latch circuit according to an embodiment of the present disclosure. The fuse latch circuit 300 may implement the fuse latches 119 of FIG. 1, the row latch 219 of FIG. 2 and/or the column latch 232 of FIG. 2 in some embodiments. The fuse latch circuit 300 includes an address latch 341 and multiple enable latch circuits 342. The address latch 341 stores an address FA from fuse data (FuseData) provided along the fuse bus. Each of the enable latch circuits 342 may receive enable information about the address FA. Each of the enable latch circuits 342 provides a respective enable signal (En1 to Enn) to an enable logic circuit 344, which determines an overall enable signal En based on the enable signals (En1 to Enn). An address logic circuit 346 may perform access operations on a group of memory cells (e.g., a row or column of memory cells) associated with the fuse latch circuit 300 based on the address FA from the fuse bus, the overall enable signal from the enable logic 344 and an externally supplied address RA.

The fuse latch circuit 300 may receive fuse data (Fuse-Data) along the fuse bus. The FuseData may be provided by a fuse array (e.g., fuse array 125 of FIG. 1) and/or fuse logic circuit (e.g., fuse logic circuit 126 of FIG. 1). The FuseData along the fuse bus may include an address to be stored in the fuse latch circuit 300. In some embodiments, the fuse bus may also include select signals, which may be used to activate a specific fuse latch circuit 300 to store the FuseData associated with the select signal. When the fuse latch circuit 300 is activated by the select signal, an address on the fuse bus may be read and stored in the fuse latch circuit 300.

The address FA may be stored in the address latch 341. The address FA may include a number of bits, and may be broadcast to the fuse latch 300 to associate the address FA with the redundant row/column associated with the fuse latch 300. Although shown as a single box, the address latch 341 may include a number of individual latch circuits, each of which may store one of the bits of the address FA.

The address from the fuse bus may be associated with enable information. In some embodiments, the address may be associated with an extra bit which includes the enable information. In some embodiments, the enable information may be contained in one or more bits of the address. When the enable information is in more than one bit, it may be extracted from the address and reduced to a single bit of information before being stored as an enable bit in each of the enable fuse latches 342.

In some embodiments, the fuse data input to the redundant fuse latches 342 may be split, such that only the bit(s) containing the enable information are provided to the enable fuse latches 342 and only the bits containing the address information are provided to the address latch 341. In some embodiments, each of the enable latch circuits 342 may save the address FA as well as the enable information and all data on the fuse bus may be provided to all of the redundant fuse latches 342.

The enable latch circuits 342 may be coupled in common to the enable information from the fuse bus. Each of the enable latch circuits 342 may receive and may store the same enable information. In some embodiments, the enable latch circuits 342 may store the enable information as an enable bit. In some embodiments, the fuse bus may also carry a select signal, which may activate the enable latch circuits 342 and may cause them to store the information on the fuse bus associated with the select signal.

Each of the enable latch circuits 342 may provide a respective enable signal (En1 to Enn) based on the enable information stored in the respective enable latch circuit 342. The enable logic circuit 344 may receive the enable signals En1 to Enn from each of the enable latch circuits 342. The enable logic circuit 344 may provide the overall enable signal En with a value based on the values of all of the enable signals En1 to Enn. For example, if none of the enable latch circuits 342 have failed, then all of the enable signals En1 to Enn should have the same value, and the value of the overall enable signal En may match the value of the enable signals En1 to Enn.

If one or more of the enable latch circuits 342 has failed then all of the enable signals En1 to Enn may not have the same value. In that case the enable logic circuit 344 may use various criteria to determine the value of overall enable signal En. For example, in some embodiments the enable logic circuit 344 may set the value of the overall enable signal En to the value of the majority of the enable signals En1 to Enn.

In some embodiments, the enable logic circuit 344 may be biased towards a particular result. For example, the enable logic circuit 344 may only provide the overall enable signal En at an active level (e.g., at a high logical level) if all of the enable signals En1 to Enn are at the active level and may provide the overall enable signal En at an inactive level if any of the enable signal En1 to Enn are inactive. This may be useful in situations where one value of the enable state is expected more often than the other value. In this particular example, the may generally be expected that most of the redundant rows/columns are unused, and so it may be useful to bias the overall enable signal to being inactive. This may increase the reliability of the overall enable signal En (e.g., increase the odds that the overall enable signal En matches the original enable information from the fuse data) in situations where the enable signals En1 to Enn do not all share the same value.

The fuse latch circuit 300 may also include an address logic circuit 346 which may be used to direct access to a group of memory cells (e.g., a row or column) coupled to the fuse latch circuit 300. The address logic circuit 346 may compare the address FA stored in the address latch circuit 341 to an external address RA provided as part of an access operation (e.g., from the row decoder 108 or column decoder 110 of FIG. 1). If the address FA matches the external address RA, and if the overall enable signal En is active, the row or column associated with the fuse latch 300 may be accessed. The address logic circuit 346 may be activated based on the state of the overall enable signal En from the enable logic 344. In some embodiments, the address logic circuit 346 may only compare the address RA and the stored address FA when the overall enable signal En is at an active level.

Figure 4:
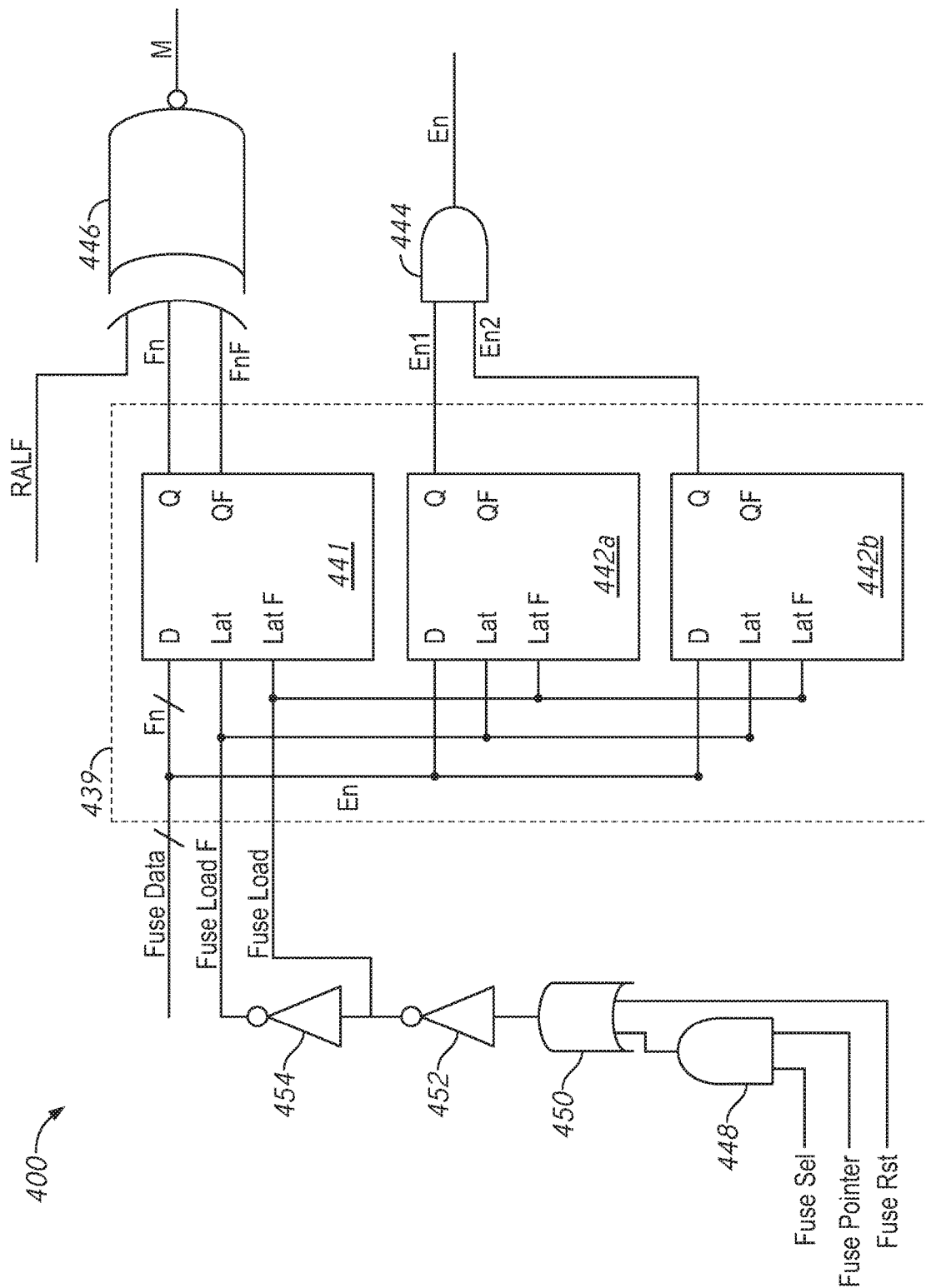
FIG. 4 is a schematic diagram depicting a fuse latch circuit according to an embodiment of the present disclosure.

FIG. 4 is a schematic diagram depicting a fuse latch circuit according to an embodiment of the present disclosure. The fuse latch circuit 400 may, in some embodiments, implement the fuse latch circuit 300 of FIG. 3.

The fuse latch circuit 400 includes a latch circuit 439 which includes an address latch 441, a first redundant enable latch 442a and a second redundant enable latch 442b. FIG. 4 shows an example embodiment with two enable latch circuits 442a-b which store the enable information and a separate address latch 441 which stores the address information. The latch circuit 439 receives data (fuseData) from a fuse bus (e.g., fuse bus 128 of FIG. 1). The latch circuit 439 is controlled by signals fuseSel, fusePointer, and fuseRst and by AND gate 448, OR gate 450, and inverters 452 and 454. The first and second redundant enable latch circuits 442a-b provide a first enable signal En1 and a second enable circuit En2, respectively, to an AND gate 444, which provides an overall enable signal En. The address latch 441 may provide address Fn (and inverse address FnF) to NOR gate 446, which may provide a match signal M based on the address (es) and an external address RALF.

The latch circuit 439 may be used to store information from a fuse bus (e.g., fuse bus 128 of FIG. 1). In the example embodiment of FIG. 4, the latch circuit 439 includes different latches (e.g., address latch 441 and redundant enable latches 442a-b) which store different information based on the data fuseData from the fuse bus. For example, the address latch 441 stores the address Fn, while each of the enable latches 442a-b stores an enable bit based on enable information associated with the address Fn.

Each of the individual latches 441-442b in the latch circuit 439 may operate in a similar manner. In some embodiments, the address latch 441 may store more bits than the redundant enable latches 442a-b in order to store the entire address Fn. Each of the individual latches 441-442b includes a data input terminal D, a pair of latch terminals Lat and LatF, and a pair of output terminals Q and QF. All the individual latches 441-442b may be coupled in common to the same inputs. In some embodiments, the latch circuit 439 may be considered as a single circuit element, with three inputs (e.g., fuseData, fuseLoad, and fuseLoadF) and four outputs (Fn, FnF, En1, and En2).

The address latch 441 may receive the fuseData signal at the input terminal D and may save a fuse address Fn that was provided along the fuse bus. The fuse address Fn may be provided from a fuse array (e.g., fuse array 125 of FIG. 1). The fuse address Fn may include a number of bits, each of which may have a state based on a state of a fuse/antifuse in the fuse array. The address latch 441 may store all of the bits of the address Fn. The address latch 441 may provide the address Fn at the output terminal Q, and may provide an inverse of the address FnF at the inverted output terminal QF. The inverted address FnF may have bits which are the opposite value of each corresponding bit in the address Fn. In some embodiments, the address Fn and the inverted address FnF may both be compared to an external address RALF in order to take into account that some addresses on the fuse bus may be inverted (e.g., from inverting fuse array 225a). The address latch 441 may save the address provided along fuseData based on the latch signals fuseLoadF and fuseLoad, as discussed in more detail herein.

The first and second enable latches 442a-b may both save enable information based on the data fuseData provided along the fuse bus. In some embodiments, the enable information may be encoded as a binary enable bit, which has a first state indicating that the row is enabled, and a second state indicating that the row is not enabled. In some embodiments, the enable information may be based on one or bits of the address Fn. Similar to the address latch 441, the first and second enable latches 442a-b may save the enable bit based on the signals fuseLoadF and fuseLoad. The first enable latch 442a may provide a first enable signal En1, and the second enable latch 442b may provide a second enable signal En2 each based on the respective stored enable bit. In some embodiments, the first and second redundant enable latches 442a-b may be identical to each other.

The memory device (e.g., device 100 of FIG. 1) may provide one or more select signals which may be used to indicate that the fuse latch 400 should save the data along fuseData. In the example embodiment of FIG. 4, three select signals fuseSel, fusePointer, and fuseRst are shown. The signals fuseLoadF and fuseLoad which signal the latch circuit 439 to save the information on fuseData may be based on the values of fuseSel, fusePointer, and fuseRst.

The signals fuseSel and fusePointer are provided as inputs to an AND gate 448. The AND gate 448 may provide a signal at a high level only when both fuseSel and fusePointer are provided at a high logical level. An OR gate 450 may accept the output of the AND gate 448 as an input and also may accept fuseRst as an input. The output of the OR gate 450 may thus be at a high logical level when both fuseSel and fusePointer are at a high logical level, or when fuseRst is at a high logical level. The signals fuseSel and fusePointer may be used to encode information about which of the fuse latches should be activated, and may be provided at a high logical level to a particular fuse latch to activate it. The signal fuseRst may be used reset the fuse latches.

The output of the OR gate 450 may be used to generate the latch signals fuseLoad and fuseLoadF. The output of the OR gate 450 is coupled to two inverters 452 and 454 in series. The output of the first inverter 452 is the signal fuseLoad, and the output of the second inverter 454 is fuseLoadF.

The first enable latch 442a provides a first enable signal En1 to a first input of the AND gate 444, and the second enable latch 442b provides the second enable signal En2 to the other input of the AND gate 444. The AND gate 444 may provide the overall enable signal En at a high level when both of the inputs En1 and En2 are at a high logical level, and may provide the overall enable signal En at a low logical level otherwise. Assuming that neither of the enable latch circuits 442a-b change states, the enable signals En1 and En2 may both be at the same state, and the overall enable signal En may match that state. If either of the redundant enable latch circuits 442a-b changes states, then the overall enable signal En may be provided at a low logical level. In that way the fuse latch circuit 400 may be biased towards providing the overall enable signal En at a low logical level. The overall enable signal En may be used to determine if the redundant row/column associated with the fuse latch 400 has been used (e.g., as part of a repair operation) or not.

An external address (e.g., an address associated with an access operation) RALF may be provided to the fuse latch 400. The XNOR gate 446 may compare the external address RALF to the address Fn and the inverse address FnF provided by the address latch 441. If the external address RALF matches either the address Fn or the inverse address FnF the XNOR gate 446 may provide the match signal M at a high level. The match signal M being at a high logical level may indicate that the access operation should be performed on a group of memory cells (e.g., a row or column) associated with the fuse latch 400.

In some embodiments, the overall enable signal En and the match signal M may be used to determine if the row/column associated with the latch circuit 400 should be accessed responsive to the external address RALF. In some embodiments, the XNOR gate 446 may only compare the external address RALF to the address in the address latch 441 if the overall enable signal En is at a high logical level.

Figure 5:
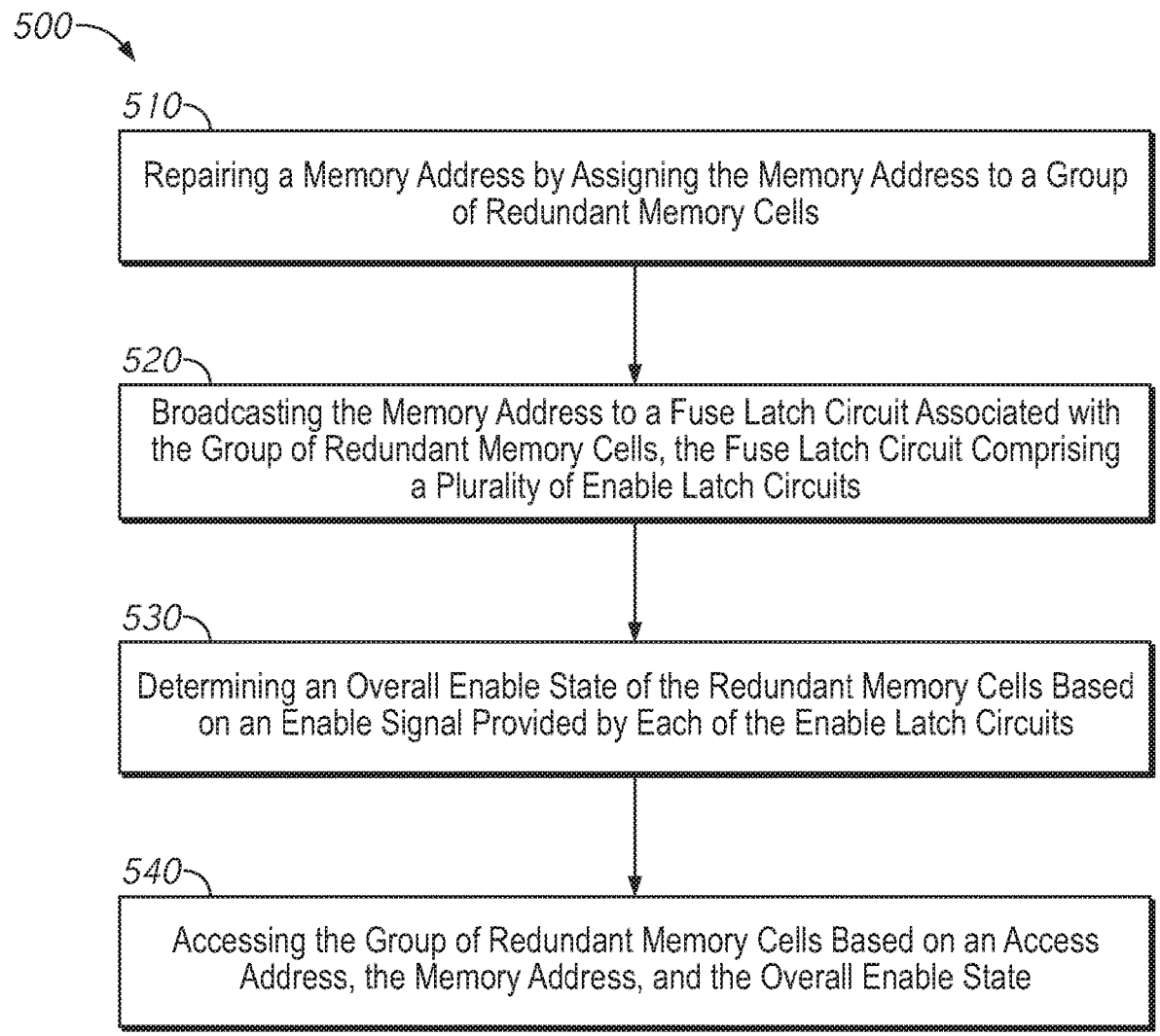
FIG. 5 is a flow chart depicting a method of managing fuse latches according to an embodiment of the present disclosure.

FIG. 5 is a flow chart depicting a method of managing fuse latches according to an embodiment of the present disclosure. The method 500 may be implemented by one or more of the devices described in FIGS. 1-4.

The method 500 may include block 510, which describes repairing a memory address. The memory address may be repaired by assigning it to a group of redundant memory cells (e.g., a redundant row or column). During the repair operation, a particular address may be determined to refer to a defective group (e.g., a row or column) of memory cells. A repair operation may be performed where the address is re-assigned to a new group of memory cells, which may be a redundant group of memory cells. An open redundant group of memory cells may be identified (e.g., by fuse logic 226 of FIG. 2). The states of fuses/anti-fuses in a fuse array (e.g., 125 of FIG. 1) may be changed to indicate that the address has been reassigned to the open group of redundant memory cells.

The method 500 may include block 520, which describes broadcasting the memory address to a fuse latch circuit associated with the group of redundant memory cells, the fuse latch circuit comprising a plurality of enable latch circuits. The address may be broadcasted as part of fuse data along a fuse bus (e.g., fuse bus 128 of FIG. 1) by a fuse array (e.g., fuse array 125 of FIG. 1). The fuse bus may pass through a plurality of fuse latches in series, such as row latches (e.g., row latches 219 of FIG. 2) and/or column latches (e.g., column latches 232 of FIG. 2). The group of redundant memory cells may be associated with a particular fuse latch circuit.

In some embodiments the fuse bus may also carry one or more select signals which may specify a particular one of the plurality of fuse latches. The select signal may cause the plurality of enable latch circuits to save enable information associated with the address. In some embodiments, enable information may be included as part of the address.

The method 500 may include block 530, which describes determining an overall enable state of the redundant memory cells based on an enable signal provided by each of the enable latch circuits. The enable latch circuits may each provide an enable signal based on the enable information stored therein (as discussed in block 520). An enable logic circuit may determine an overall enable state based on the enable signals. In some embodiments, the enable logic may be biased towards a certain result. In some embodiments, the enable logic may return a first result unless all of the enable signals have a second value, in which case a second result may be provided.

The method 500 may include block 540, which describes accessing the group of redundant memory cells based on an access address, the memory address, and the overall enable state. As part of an access command, the access address may be provided by, for example, a row and/or column decoder (e.g., 108 or 110 of FIG. 1). The memory address may be compared to the access address, to determine if the memory address or its inverse matches the access address. If the memory address and the access address match, and the overall enable signal is active, the access operation may be directed to the group of redundant memory cells associated with the plurality of enable latch circuits.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a first enable latch circuit configured to receive fuse bus data and provide a first enable signal based on the fuse bus data;
a second enable latch circuit configured to receive the fuse bus data and provide a second enable signal based on the fuse bus data; and
enable logic configured to provide a third enable signal based on the first enable signal and the second enable signal, wherein a row or column of memory cells associated with the first enable latch circuit and the second enable latch circuit is accessed responsive to the third enable signal.

2. The apparatus of claim 1, wherein the enable logic is an AND gate.

3. The apparatus of claim 1, further comprising a fuse array configured to provide the fuse bus data, wherein a value of the fuse bus data is based on states of a plurality of fuses of the fuse array.

4. The apparatus of claim 1, further comprising an address logic circuit configured to access the row or column of memory cells based on the third enable signal, an address based on the fuse bus data, and an external address.

5. The apparatus of claim 1, wherein the first enable latch circuit and the second enable latch circuit have a same configuration.

6. The apparatus of claim 1, wherein an input of the first enable latch circuit is coupled to a fuse bus in common with an input of the second enable latch circuit.

7. The apparatus of claim 1, wherein the first and the second enable latch circuits are each configured to store an enable bit based on enable information associated with the fuse bus data, and provide the respective first and the second enable signal based on the respective stored enable bits.

8. An apparatus comprising:
a memory array comprising a plurality of memory cells arranged in rows and columns; and
a plurality of fuse latch circuits each associated with a row or a column of the memory array, wherein each of the plurality of fuse latches comprises:
a plurality of enable latch circuits, each of the enable latch circuits configured to store enable information associated with a received address and provide a respective one of a plurality of redundant enable signals based on the store enable information;
an enable logic circuit configured to provide an overall enable signal based on the plurality of redundant enable signals from the plurality of enable latch circuits; and
an address logic circuit configured to access the row or the column based on the address, the overall enable signal, and an external address.

9. The apparatus of claim 8, wherein the enable logic is configured to provide the overall enable signal at a first logical level when each of the plurality of redundant enable signals are at the first logical level and provide the overall enable signal at a second logical level if any of the plurality of redundant enable signals are at the second logical level.

10. The apparatus of claim 8, further comprising a fuse array configured to provide the address.

11. The apparatus of claim 10, further comprising a fuse bus coupling the fuse array to the plurality of fuse latch circuits.

12. The apparatus of claim 8, wherein each of the plurality of fuse latch circuits comprise an address latch configured to store the address.

13. The apparatus of claim 8, wherein the enable state of the address is encoded in at least one bit of the address.

14. The apparatus of claim 8, wherein each of the plurality of fuse latch circuits is associated with a redundant row or a redundant column of the memory array.

15. A method comprising:
assigning a memory address to a group of redundant memory cells;

broadcasting the memory address to a fuse latch circuit associated with the group of redundant memory cells, the fuse latch circuit comprising a plurality of enable latch circuits;

determining an overall enable state of the redundant memory cells based on a plurality of enable signals provided by each of the enable latch circuits; and accessing the group of redundant memory cells based on an access address, the memory address, and the overall enable state.

16. The method of claim 15, further comprising changing the state of at least one of a group of fuses in a fuse array and wherein broadcasting the memory address comprises broadcasting the states of the group of fuses.

17. The method of claim 15, further comprising storing enable information associated with the address in the plurality of enable latch circuits and determining values of the plurality of enable signals based on the stored enable information.

18. The method of claim 17, further comprising determining a value of the enable information based on at least one bit of the address.

19. The method of claim 15, wherein the overall enable state is determined to be at a first level when each of the plurality of enable signals are at the first level and determined to be at a second level otherwise.

20. The method of claim 19, wherein the first level is associated with the group of redundant memory cells being in use and the second level is associated with the group of redundant memory cells not being in use.

* * * * *